United States Patent
Lin et al.

(10) Patent No.: US 9,831,183 B2
(45) Date of Patent: Nov. 28, 2017

(54) CONTACT STRUCTURE AND METHOD OF FORMING

(71) Applicant: Taiwan Semiconductor Manufacturing Company, Ltd., Hsin-Chu (TW)

(72) Inventors: Yu-Hung Lin, Taichung (TW); Mei-Hui Fu, Hsin-Chu (TW); Sheng-Hsuan Lin, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/532,886

(22) Filed: Nov. 4, 2014

(65) Prior Publication Data

US 2016/0043035 A1     Feb. 11, 2016

Related U.S. Application Data

(60) Provisional application No. 62/034,424, filed on Aug. 7, 2014.

(51) Int. Cl.
*H01L 23/532* (2006.01)
*H01L 21/768* (2006.01)
(Continued)

(52) U.S. Cl.
CPC .. *H01L 23/53266* (2013.01); *H01L 21/28518* (2013.01); *H01L 21/76802* (2013.01);
(Continued)

(58) Field of Classification Search
CPC ......... H01L 23/53266; H01L 21/28518; H01L 23/485; H01L 21/76843; H01L 21/76855;
(Continued)

(56) References Cited

U.S. PATENT DOCUMENTS 5,644,166 A * 7/1997 Honeycutt ........ H01L 21/28518
257/754
5,985,756 A * 11/1999 Shinmura ......... H01L 21/76843
257/E21.584

(Continued)

FOREIGN PATENT DOCUMENTS

JP    2011100962    5/2011
KR    20070003058   1/2007
(Continued)

OTHER PUBLICATIONS

Ju, "A Comparison of Device Architecture, Electrical Performance and Process flow between FinFET and Planar MOSFETs", ECS Transactions, 60 (1), 2014, pp. 745-750.

*Primary Examiner* — Latanya N Crawford
(74) *Attorney, Agent, or Firm* — Slater Matsil, LLP

(57) ABSTRACT

Contact structures and methods of forming contacts structures are contemplated by this disclosure. A structure includes a dielectric layer over a substrate, an adhesion layer, a silicide, a barrier layer, and a conductive material. The dielectric layer has an opening to a surface of the substrate. The adhesion layer is along sidewalls of the opening. The silicide is on the surface of the substrate. The barrier layer is on the adhesion layer and the silicide, and the barrier layer directly adjoins the silicide. The conductive material is on the barrier layer in the opening.

20 Claims, 4 Drawing Sheets

(51) Int. Cl.
*H01L 21/285* (2006.01)
*H01L 23/485* (2006.01)
*H01L 21/762* (2006.01)

(52) U.S. Cl.
CPC .. *H01L 21/76843* (2013.01); *H01L 21/76846* (2013.01); *H01L 21/76855* (2013.01); *H01L 23/485* (2013.01); *H01L 21/76224* (2013.01); *H01L 21/76814* (2013.01); *H01L 2924/0002* (2013.01)

(58) Field of Classification Search
CPC ......... H01L 21/76802; H01L 21/76846; H01L 2924/0002; H01L 21/76224; H01L 21/76814
See application file for complete search history.

(56) References Cited

U.S. PATENT DOCUMENTS

| | | | |
|---|---|---|---|
| 6,177,338 B1* | 1/2001 | Liaw | H01L 21/02129 257/E21.252 |
| 7,525,197 B2* | 4/2009 | Chikarmane | H01L 21/76844 257/751 |
| 8,039,391 B1* | 10/2011 | Yin et al. | 438/656 |
| 2001/0007797 A1* | 7/2001 | Jang | C23C 16/0272 438/761 |
| 2002/0019127 A1* | 2/2002 | Givens | H01L 21/28518 438/637 |
| 2002/0064944 A1* | 5/2002 | Chung | H01L 21/02063 438/637 |
| 2003/0020165 A1* | 1/2003 | Matsumoto | 257/751 |
| 2006/0076680 A1* | 4/2006 | Williams et al. | 257/757 |
| 2006/0278985 A1* | 12/2006 | Lim | H01L 21/28518 257/741 |
| 2008/0026556 A1* | 1/2008 | Chikarmane | H01L 21/76844 438/597 |
| 2010/0216305 A1* | 8/2010 | Wada | H01L 21/28556 438/655 |
| 2013/0040440 A1* | 2/2013 | Adam | H01L 21/0237 438/478 |
| 2014/0199837 A1* | 7/2014 | Hung | H01L 21/76816 438/675 |
| 2015/0348973 A1* | 12/2015 | Moritoki | H01L 29/41783 257/392 |

FOREIGN PATENT DOCUMENTS

| KR | 20080004303 | 1/2008 |
|---|---|---|
| KR | 20090078109 | 7/2009 |

* cited by examiner

CONTACT STRUCTURE AND METHOD OF FORMING

PRIORITY CLAIM AND CROSS-REFERENCE

This application claims the benefit of U.S. Provisional Application No. 62/034,424, filed on Aug. 7, 2014, entitled "Method of Ti Salicide Formation with Low Resistance and Resulting Structure," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

It is generally desirable for semiconductor devices to operate at a fast speed. Further, it is generally desirable to reduce a size of semiconductor devices to increase device density and allow increased functionality of the electronic applications. These two features can sometimes be at odds. Some features of a semiconductor device, when reduced in size, may actually result in a slower speed. Solutions that can achieve both fast speeds and reduced size are desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
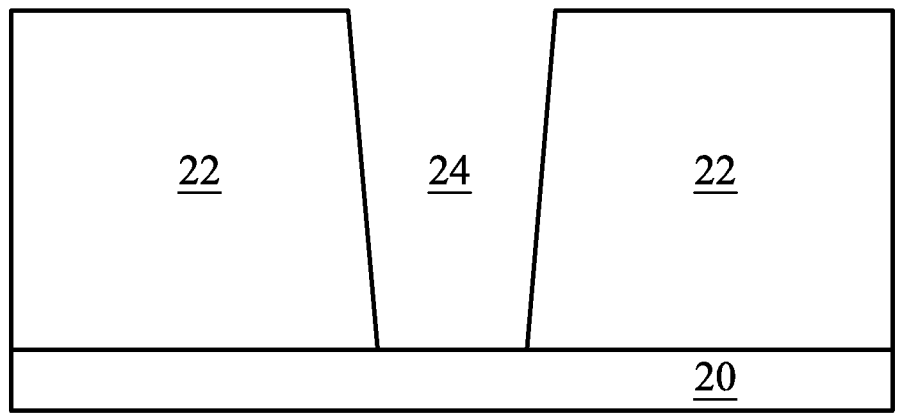
FIGS. 1 through 6 are intermediate stages of forming a contact structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A contact structure and methods of forming the same are provided in accordance with various embodiments. Intermediate stages of forming a contact structure are illustrated. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIGS. 1 through 6 illustrate intermediate stages of forming a contact structure in accordance with some embodiments. FIG. 1 illustrates a dielectric layer 22 over a substrate 20 and an opening 24 formed through the dielectric layer 22 to the substrate 20. The substrate 20 may be a bulk semiconductor substrate, a semiconductor-on-insulator (SOI) substrate, a multi-layered or gradient substrate, or the like, and may be doped (e.g., with a p-type or an n-type dopant) or undoped. The substrate 20 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, such as a silicon or glass substrate. In some embodiments, the semiconductor material of the substrate 20 may include an elemental semiconductor material, such as silicon, germanium, or the like; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. Additionally, the substrate 20 can comprise epitaxy regions that can, for example, increase a carrier mobility through a device in the substrate 20. For example, a source/drain region of a transistor can include an epitaxy region that is a different material from a material of the substrate 20. The epitaxy region can be any of the materials previously listed for the substrate 20. The opening 24 can be formed to an epitaxy region.

The dielectric layer 22 can comprise one or more dielectric layers. For example, the dielectric layer 22 can comprise an etch stop layer over the substrate 20, and an Inter-Layer Dielectric (ILD) over the etch stop layer. Generally, the etch stop layer provides a mechanism to stop an etching process when forming the opening 24. The etch stop layer is formed of a dielectric material having a different etch selectivity from adjacent layers, e.g., an etch stop layer between the underlying substrate 20 and the overlying ILD. In an embodiment, the etch stop layer may be formed of SiN, SiCN, SiCO, CN, a combination thereof, or the like, deposited by any suitable method, such as chemical vapor deposition (CVD), plasma-enhanced CVD (PECVD), or the like. The ILD is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, or the like. The dielectric layer 22 can comprise additional layers, such as a hardmask layer, a chemical mechanical polish (CMP) stop layer, or the like over the ILD.

The opening 24 is formed through the dielectric layer 22 using, for example, an acceptable photolithography and etching process(es). The etching may be any acceptable etch process, such as a reactive ion etch (RIE), neutral beam etch (NBE), the like, or a combination thereof. The etch may be anisotropic. The etching may form an opening with substantially vertical sidewalls, although non-vertical sidewalls are contemplated in some embodiments.

A cleaning process may be performed to remove any undesirable oxide that may be formed as a result of the natural oxidation of the exposed surface of the substrate 20 in the opening 24. In some embodiments, the cleaning process uses an HF-based gas or a $NF_3$-based and/or a $NH_3$-based gas. In other embodiments, a high-temperature baking is performed. The high-temperature baking may be performed with or without the presence of HCl gas. The baking temperature may be in a range between about 700° C. and about 900° C. The pressure of baking may be in a range between about 10 Torr and about 200 Torr. The baking duration may be in a range between about 30 seconds and about 4 minutes, for example.

Figure 2:
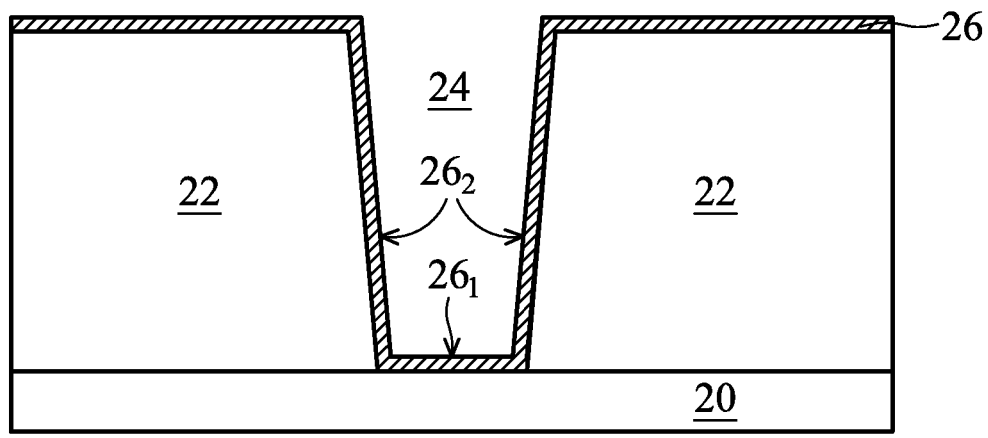

In FIG. 2, an adhesion layer 26 is formed along surfaces of the opening 24. In some embodiments, the adhesion layer 26 is a metal layer, such as consisting of titanium, nickel, tungsten, cobalt, a metal alloy, or the like. The adhesion layer 26 can be formed using an acceptable deposition process, such as physical vapor deposition (PVD), CVD, atomic layer deposition (ALD), or the like. In the illustrated embodiment, the adhesion layer 26 is titanium deposited by PVD. A first portion $26_1$ of the adhesion layer 26 is formed on a surface of the substrate 20, and second portions $26_2$ of the adhesion layer 26 are formed on the sidewalls of the opening 24. As a result of the PVD deposition, a thickness of the first portion $26_1$ (e.g., in a direction normal to the surface of the substrate 20) can be greater than a thickness of the second portions $26_2$ (e.g., in a direction normal to a respective sidewall surface of the dielectric layer 22). For example, in some embodiments, the thickness of the first portion $26_1$ is from about 50 Å to about 300 Å, and the thickness of the second portions $26_2$ is from about 5 Å to about 50 Å.

Figure 3:
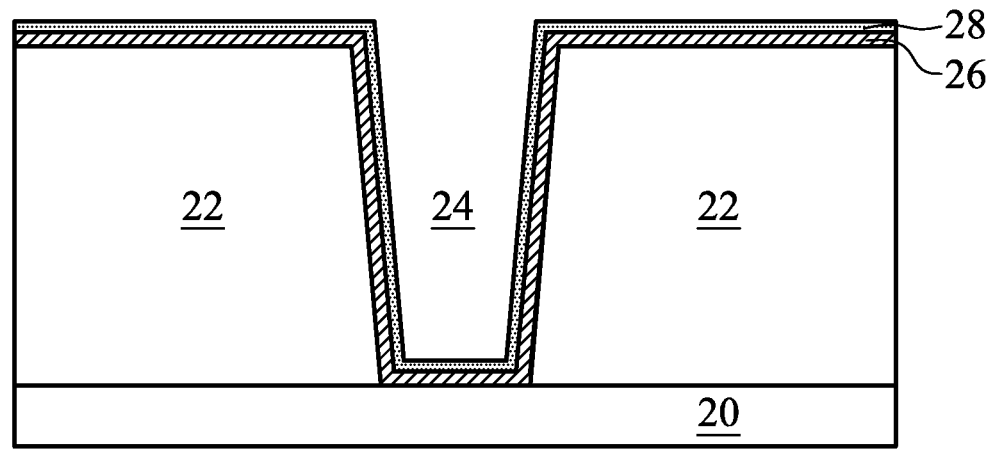

In FIG. 3, a barrier layer 28 is formed on the adhesion layer 26. In some embodiments, the barrier layer 28 is a metal-nitride layer, such as comprising titanium nitride, tantalum nitride, a combination thereof, or the like. The barrier layer 28 can be formed using an acceptable deposition process such as CVD, ALD, or the like. In the illustrated embodiment, the barrier layer 28 is titanium nitride deposited by CVD. The barrier layer 28 may be conformally deposited with a substantially uniform thickness, although embodiments contemplate some variation in thickness. For example, in some embodiments, a thickness of the barrier layer 28 on the first portion $26_1$ is from about 15 Å to about 50 Å, and the thickness of the barrier layer 28 on the second portions $26_2$ is from about 5 Å to about 40 Å. It should be noted that although the adhesion layer 26 and the barrier layer 28 are discussed as such, each could function independently or with each other as an adhesion layer and/or a barrier layer.

Figure 4:
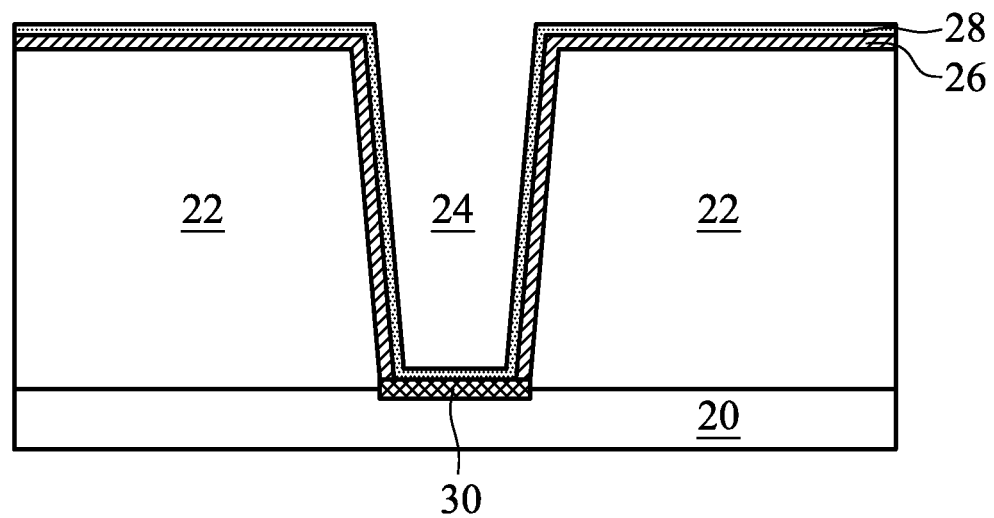

In FIG. 4, a silicide region 30 is formed on the substrate 20. The silicide region 30 includes a reacted material formed from a reaction between the first portion $26_1$ of the adhesion layer 26 and a material of the substrate 20. The silicide region 30 can be formed by using an anneal process. In some embodiments, an anneal process can include placing the structure of FIG. 3 in an environment at a temperature from about 400° C. to about 900° C. for a duration from about 20 seconds to about 180 seconds. In some embodiments, a thickness of the silicide region 30 is from about 40 Å to about 250 Å. In some embodiments, the anneal process causes a reaction between the substrate 20 and the first portion $26_1$ of the adhesion layer 26 such that some or the entirety of the first portion $26_1$ is consumed by the reaction. Hence, in some embodiments, the bottom portion of the barrier layer 28 can directly adjoin the silicide region 30, and in some embodiments, no adhesion layer 26 is disposed between the bottom portion of the barrier layer 28 and the silicide region 30. The silicide region 30 may comprise a material of the adhesion layer 26 and a material of the substrate 20. For example, assuming the adhesion layer 26 is titanium and the substrate 20 adjoining the adhesion layer 26 (e.g., before the reaction) is silicon, the silicide region 30 can be TiSi. Further, a material, e.g., metal, of the adhesion layer 26 on the sidewalls of the opening 24 is a same material, e.g., metal, in the silicide region 30.

Figure 5:
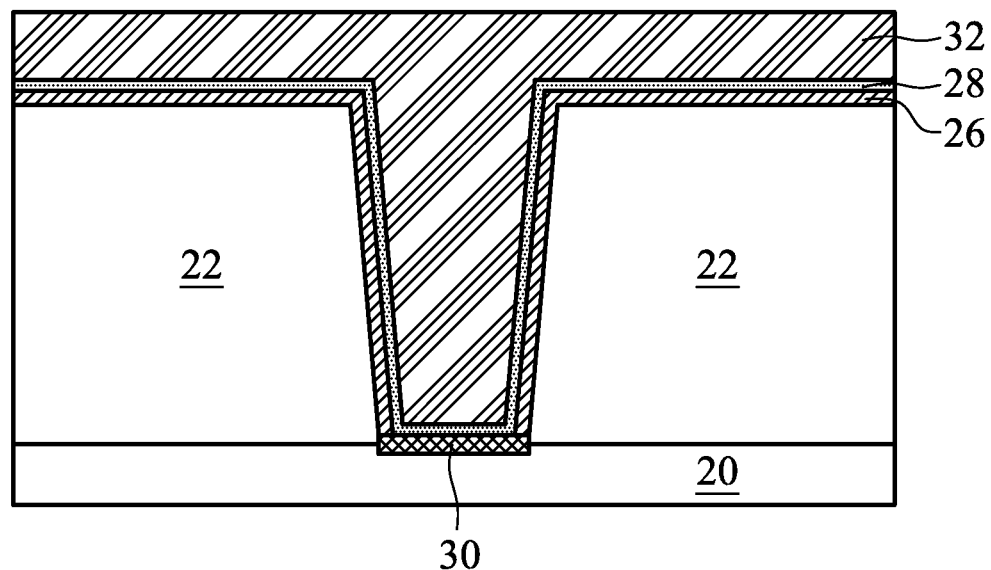

In FIG. 5, a conductive material 32 is formed in the opening 24. The conductive material 32 may be a metal, such as tungsten, copper, aluminum, nickel, gold, silver, a metal alloy, or the like. The conductive material 32 can be formed using an acceptable deposition process such as CVD, PVD, or the like. In the illustrated embodiment, the conductive material 32 is tungsten deposited by CVD. As illustrated, the conductive material 32 fills the remaining portion of the opening 24 and is formed over the dielectric layer 22.

Figure 6:
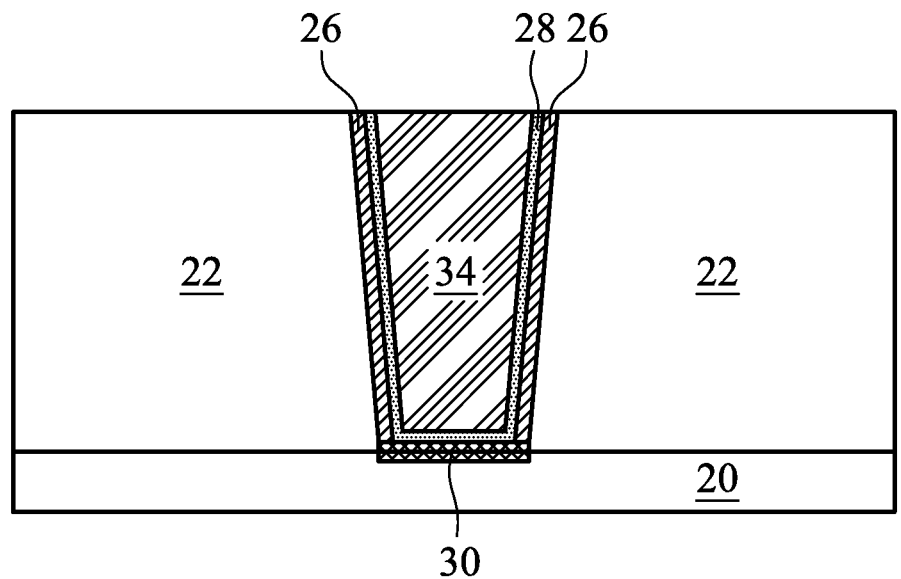

In FIG. 6, a planarization process, such as a CMP, is performed to remove excess portions of the conductive material 32, barrier layer 28, and adhesion layer 26. The planarization process forms a contact 34 in the opening 24 with top surfaces of the dielectric layer 22, adhesion layer 26, barrier layer 28, and contact 34 being co-planar.

Figure 7:
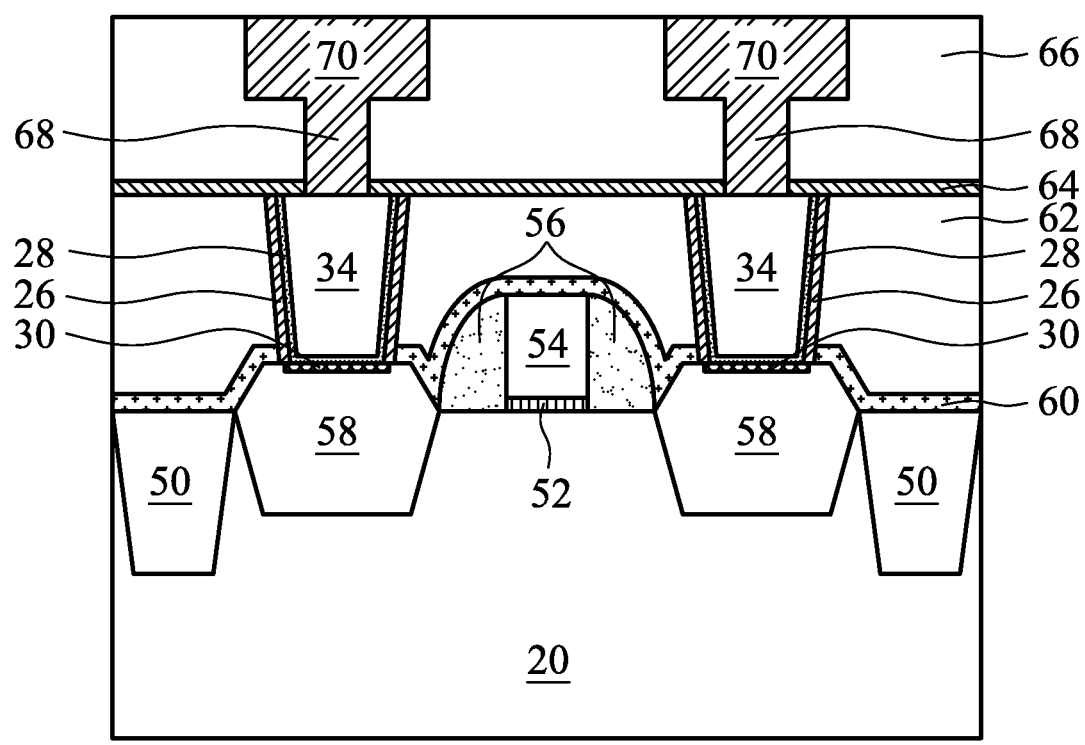
FIG. 7 is an example application of the contact structure and contact structure formation process in accordance with some embodiments.

FIG. 7 illustrates an example application of the contact structure and contact structure formation process discussed in FIGS. 1 through 6. FIG. 7 illustrates a circuit component, such as a field effect transistor (FET), to which a contact is formed. The circuit component can be a p-type FET (pFET) or an n-type FET (nFET). In the illustrated example, the circuit component is a planar FET, although other embodiments contemplate a three-dimensional fin FET (finFET). Other circuit components are contemplated by various other embodiments.

The circuit component in FIG. 7 includes a substrate 20, isolation regions 50, gate dielectric 52, gate electrode 54, gate spacers 56, source/drain epitaxial regions 58, etch stop layer 60, ILD 62, silicide region 30, adhesion layer 26, barrier layer 28, contact 34, etch stop layer 64, Inter-Metal Dielectric (IMD) 66, via 68, and line 70. The circuit component may be formed as described in the following.

A substrate 20 is provided. The substrate 20 may be any substrate such as previously discussed with respect to FIG. 1. Isolation regions 50 are then formed in the substrate 20. The isolation regions 50 may be formed by etching recesses and/or trenches in the substrate 20 and filling the recesses or trenches with an insulating material. The etching may be any acceptable etch process, such as a RIE, NBE, the like, or a combination thereof. The etch may be anisotropic. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. A planarization process, such as a CMP, may remove any excess insulation material and form top surfaces of the isolation regions 50 and top surface of the substrate 20 that are co-planar. The isolation regions 50 may define active areas in the substrate 20 where a circuit component will be formed. A well may be formed in the active area. For example, dopants may be implanted to a concentration of equal to or less than $10^{18}$ cm$^{-3}$, such as between about $10^{17}$ cm$^{-3}$ and about $10^{18}$ cm$^{-3}$, to form the well. P-type impurities, e.g., for a well of an n-type circuit component, include boron, $BF_2$, or the like, and n-type impurities, e.g., for a well of a p-type circuit component, include phosphorus, arsenic, or the like. An anneal may be used to activate the implanted impurities.

Subsequently, the gate dielectric 52 and gate electrode 54 are formed on the substrate 20. A layer of gate dielectric material is deposited on the substrate 20. In some embodiments, the gate dielectric material comprises silicon oxide, silicon nitride, a high-k dielectric material, multilayers thereof, or the like. A high-k dielectric material may have a k value greater than about 7.0, and may include a metal oxide or a silicate of Hf, Al, Zr, La, Mg, Ba, Ti, Pb, and combinations thereof. The formation methods of the layer of gate dielectric material may include CVD, Molecular-Beam Deposition (MBD), ALD, PECVD, or the like. A layer of gate electrode material is deposited on the layer of gate dielectric material. The gate electrode material may be polysilicon, doped or un-doped; a metal-containing material such as TiN, TaN, TaC, Co, Ru, Al, combinations thereof, or multi-layers thereof; or any other suitable material. The formation methods of the layer of gate electrode material may include CVD, ALD, PECVD, or the like. A mask layer may be formed on the layer of gate electrode material. The mask layer may comprise silicon nitride, silicon carbon nitride, CN, or the like, and may be deposited by CVD, PECVD, or the like. The mask layer, gate electrode material, and gate dielectric material may then be patterned using an acceptable photolithography and etching process(es) to form a mask (not illustrated), the gate electrode 54, and the gate dielectric 52. The etching may be any acceptable etch process, such as a RIE, NBE, the like, or a combination thereof. The etch may be anisotropic.

Then, implants for lightly doped source/drain (LDD) regions (not illustrated) may be performed. The patterned mask, gate electrode 54, and/or gate dielectric 52 may serve as a self-aligned mask for the implantation to form the lightly doped source/drain regions in the substrate 20. P-type impurities, e.g., for a p-type circuit component, include boron, $BF_2$, or the like, and n-type impurities, e.g., for an n-type circuit component, include phosphorus, arsenic, or the like. The lightly doped source/drain regions may have a concentration of impurities of from about $10^{15}$ cm$^{-3}$ to about $10^{16}$ cm$^{-3}$. An anneal may be used to activate the implanted impurities.

Gate spacers 56 are then formed along the gate dielectric 52 and gate electrode 54. A layer of spacer material is conformally deposited on the substrate 20. The spacer material may be silicon nitride, SiCN, a combination thereof, or the like, and may be deposited by CVD, PECVD, or the like. An anisotropic etch is performed to pattern the gate spacers 56. The anisotropic etch can remove horizontal portions of the layer of the spacer material such that portions of the layer of the spacer material on sidewalls of the gate electrode 54 and gate dielectric 52 remain as the gate spacers 56. The etching may be any acceptable etch process, such as a RIE, NBE, the like, or a combination thereof.

Then, source/drain epitaxial regions 58 are formed. Recesses can be formed in the substrate 20. The recessing may comprise an etch that is selective to a material of the substrate 20, where, for example, the gate spacers 56, the mask on the gate electrode 54, and the isolation regions 50 are generally not etched. Hence, the recesses may be defined in the active area of the substrate that is not covered by the gate spacers 56 and gate dielectric 52 and outside of the isolation regions 50. The etching process may be any suitable etching process, such as dry or wet, and isotropic or anisotropic. The source/drain epitaxial regions 58 are epitaxially grown in the recesses, such as by metal-organic CVD (MOCVD), molecular beam epitaxy (MBE), liquid phase epitaxy (LPE), vapor phase epitaxy (VPE), selective epitaxial growth (SEG), the like, or a combination thereof. The source/drain epitaxial regions 58 may comprise any acceptable material. Example material that may be appropriate for an n-type circuit component may include silicon, SiC, SiCP, SiP, or the like. Example material that may be appropriate for a p-type circuit component may include SiGe, SiGeB, or the like. The source/drain epitaxial regions 58 may have surfaces raised from the top surface of the substrate 20 and may have facets.

The source/drain epitaxial regions 58 may be implanted with dopants to form source/drain regions, similar to the process previously discussed for forming lightly doped source/drain regions, followed by an anneal. P-type impurities, e.g., for a p-type circuit component, include boron, $BF_2$, or the like, and n-type impurities, e.g., for an n-type circuit component, include phosphorus, arsenic, or the like. The source/drain regions may have an impurity concentration of between about $10^{19}$ cm$^{-3}$ and about $10^{21}$ cm$^{-3}$. In other embodiments, the source/drain epitaxial regions 58 may be in situ doped during growth, or doped by in situ doping in combination with implanting dopants.

The mask over the gate electrode 54, if present, and upper portions of the gate spacers 56 may be subsequently removed, such as by an anisotropic etch. The etching may be any acceptable etch process, such as a RIE, NBE, the like, or a combination thereof. After the etch, the gate spacers 56, gate electrode 54, and gate dielectric 52 may be formed as illustrated in FIG. 7.

The etch stop layer 60 is conformally formed over the substrate 20, isolation regions, source/drain epitaxial regions 58, gate spacers 56 and gate electrode 54. In an embodiment, the etch stop layer 60 may be formed of SiN, SiCN, SiCO, CN, a combination thereof, or the like, deposited by any suitable method, such as CVD, PECVD, or the like. The ILD 62 is formed on the etch stop layer 60. The ILD 62 can be formed of a dielectric material such as PSG, BSG, BPSG, USG, or the like, and may be deposited by any suitable method, such as CVD, PECVD, or the like. The ILD 62 may be planarized, such as by CMP, to have a planar top surface.

Then, contact structures each comprising adhesion layer 26, barrier layer 28, silicide region 30, and contact 34 are formed through the ILD 62 and etch stop layer 60 to a respective source/drain epitaxial region 58. In other embodiments where source/drain epitaxial regions 58 are not formed, the contact structures are formed to the substrate 20. The contact structures may be formed as previously discussed with respect to FIGS. 1 through 6.

The etch stop layer 64 is formed on the ILD 62 and the contact structures. In an embodiment, the etch stop layer 64 may be formed of SiN, SiCN, SiCO, CN, a combination thereof, or the like, deposited by any suitable method, such as CVD, PECVD, or the like. The IMD 66 is formed on the etch stop layer 64. The IMD 66 can be formed of a dielectric material such as PSG, BSG, BPSG, USG, or the like, and may be deposited by any suitable method, such as CVD, PECVD, or the like.

Interconnect structures, e.g., comprising a line 70 and a via 68, are formed in the IMD 66. The interconnect structures may be formed by using suitable photolithography techniques. Generally, a photolithography and etching process(es) is performed to remove a portion of the IMD 66 corresponding to the interconnect structures to define recesses and/or openings in the IMD 66. After the etching process, the recesses and/or openings may be filled with a conductive material such as one or more layers of metals, elemental metals, transition metals, or the like. In some embodiments, the conductive material used to fill the recesses and/or openings is copper deposited by electrochemical plating (ECP). Other conductive materials and processes may be used.

It should be noted that the interconnect structures may comprise a barrier/adhesion layer formed of one or more layers of conductive materials, such as titanium, titanium nitride, tantalum, tantalum nitride or the like. In an embodiment, the adhesion/barrier layer may comprise a thin layer of tantalum nitride followed by a thin layer of tantalum. The tantalum nitride and tantalum layers may be formed, for example, by CVD, PVD, or the like. A planarization process, such as CMP, may be performed to remove the excess barrier layer material and/or conductive material. The formed interconnect structure thus are coupled to the contact structures. Additional IMD and interconnect structures may be formed.

Although the circuit component in FIG. 7 is discussed as being formed in what may be referred to as a gate-first process, one of ordinary skill in the art will readily understand modifications such that aspects disclosed herein may be applied to a gate-last or replacement gate process. Embodiments contemplate applications to such processes.

Embodiments may achieve advantages. First, a process of forming a contact structure with a silicide region may be simplified because a step of removing unreacted metal used for the silicidation may be obviated. Further, the thickness of a silicide region may be more easily controlled because an amount of the metal may determine the thickness of the silicide region rather than a temperature or duration of an anneal. Additionally, no adhesion layer is disposed between the barrier layer and the silicide region such that resistance may be reduced. By reducing resistance, a resistance-capacitance (RC) time constant may be decreased, which may result in faster device operation, even at reduced sizes. Other advantages may be achieved.

In accordance with an embodiment, a structure comprises a dielectric layer over a substrate, an adhesion layer, a silicide, a barrier layer, and a conductive material. The dielectric layer has an opening to a surface of the substrate. The adhesion layer is along sidewalls of the opening. The silicide is on the surface of the substrate. The barrier layer is on the adhesion layer and the silicide, and the barrier layer directly adjoins the silicide. The conductive material is on the barrier layer in the opening.

In accordance with another embodiment, a structure comprises a dielectric layer over a substrate, a titanium layer, a titanium-containing silicide, a titanium nitride layer, and a conductive material. An opening is through the dielectric layer to the substrate. The titanium layer is on dielectric sidewalls of the opening. The titanium-containing silicide is on the substrate. The titanium nitride layer is on the titanium layer and on the titanium-containing silicide, and no portion of the titanium layer is disposed between at least a portion of the titanium nitride layer and at least a portion of the titanium-containing silicide. The conductive material is on the titanium nitride layer in the opening.

In accordance with a further embodiment, a method comprises forming an opening through a dielectric layer to a substrate, a bottom surface of the opening being a surface of a semiconductor material; forming an adhesion layer along sidewalls of the opening and on the surface of the semiconductor material; forming a barrier layer on the adhesion layer; after forming the barrier layer, reacting the adhesion layer with the semiconductor material to form a silicide; and forming a conductive material on the adhesion layer in the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a dielectric layer over a planar top surface of a substrate, the dielectric layer having an opening to an epitaxial layer that extends above the top surface of the substrate;
   an adhesion layer along sidewalls of the opening, wherein the adhesion layer comprises a metal;
   a silicide on the planar top surface of the substrate;
   a barrier layer on the adhesion layer, the barrier layer different than the adhesion layer and comprising a metal nitride of a same metal as in the adhesion layer, the barrier layer including a first region adjacent the silicide and having a first thickness and including a second region adjacent sidewalls of the opening, the second region having a second thickness less than the first thickness, the barrier layer physically contacting the silicide, the adhesion layer extending between the barrier layer and the silicide, wherein an entirety of the silicide comprises a same metal as in the adhesion layer; and
   a conductive material on the barrier layer in the opening.

2. The structure of claim 1, wherein the adhesion layer is titanium, the barrier layer is titanium nitride, and the silicide comprises titanium.

3. The structure of claim 1, wherein a thickness of the adhesion layer is between 5 Å and 50 Å.

4. The structure of claim 1, wherein a thickness of the silicide is between 40 Å and 250 Å.

5. The structure of claim 1, wherein a thickness of the first region of the barrier layer is between 15Å and 50 Å and a thickness of the second region of the barrier layer is between 5 Å and 40 Å.

6. The structure of claim 1, wherein the conductive material is tungsten.

7. A structure comprising:
   a dielectric layer over a substrate, an opening being through the dielectric layer to an epitaxial layer above a top surface of the substrate;

a titanium layer on dielectric sidewalls of the opening;

a titanium-containing silicide on the substrate;

a titanium nitride layer on the titanium layer and directly on the titanium-containing silicide, no portion of the titanium layer being disposed between at least a portion of the titanium nitride layer and at least a portion of the titanium-containing silicide, wherein the titanium nitride layer has a first thickness where it contacts the titanium-containing silicide and a second thickness, different from the first thickness where it contacts the titanium layer; and a conductive material on the titanium nitride layer in the opening.

8. The structure of claim 7, wherein a thickness of the titanium layer is between 5 Å and 50 Å.

9. The structure of claim 7, wherein a thickness of the titanium-containing silicide is between 40 Å and 250 Å.

10. The structure of claim 7, wherein a thickness of the titanium nitride layer is between 15 Å and 50 Å where it contacts the titanium-containing silicide and is between 5 Å and 40Å where it contacts the titanium layer.

11. The structure of claim 7, wherein the conductive material is tungsten.

12. The structure of claim 7, wherein the titanium nitride layer directly adjoins the titanium-containing silicide.

13. A method comprising:

forming an opening through a dielectric layer to an epitaxial layer disposed above a top surface of a substrate, a bottom surface of the opening being a surface of a semiconductor material;

cleaning the surface using a high-temperature bake at a temperature between about 700° C. and about 900° C.;

forming an adhesion layer along sidewalls of the opening and on the surface of the semiconductor material;

depositing a barrier layer conformally on the adhesion layer to a first thickness along the sidewalls of the opening and a second thickness along a bottom of the opening, wherein the second thickness is greater than the first thickness, and the barrier layer comprises a metal nitride;

after forming the barrier layer, reacting the adhesion layer with the semiconductor material to form a silicide, wherein after the reacting, the barrier layer directly adjoins the silicide; and forming a conductive material on the adhesion layer in the opening.

14. The method of claim 13, wherein the reacting comprises an anneal.

15. The method of claim 13, wherein a thickness of the adhesion layer formed on the surface of the semiconductor material is between 50 Å and 300 Å.

16. The method of claim 13, wherein a thickness of the silicide is between 40 Å and 250 Å.

17. The method of claim 13, wherein a thickness of the barrier layer is between 5 Å and 50 Å.

18. The method of claim 13, wherein the conductive material is tungsten.

19. The method of claim 13, wherein the adhesion layer is titanium, the barrier layer is titanium nitride, and the silicide comprises titanium.

20. A method comprising:

etching an opening through a dielectric layer to an epitaxial layer above a top surface of a substrate, a bottom surface of the opening being a surface of a semiconductor material in the substrate;

performing a cleaning process on the dielectric layer and the bottom surface;

depositing a titanium layer deposited by physical vapor deposition (PVD) along sidewalls of the opening and on the surface of the semiconductor material, a first thickness of the titanium layer on the surface of the semiconductor material being greater than a second thickness of the titanium layer on the sidewalls of the opening, the first thickness being between 50 Å and 300 Å, the second thickness being between 5 Å and 50 Å;

depositing a titanium nitride layer deposited by chemical vapor deposition (CVD) on the titanium layer, a third thickness of the titanium nitride layer on the titanium layer on the surface of the semiconductor material being between 15 Å and 50 Å, a fourth thickness of the titanium nitride layer on the titanium layer on the sidewalls of the opening being between 5 Å and 40 Å, with the fourth thickness being greater than the third thickness;

after depositing the titanium nitride layer, reacting the titanium layer with the semiconductor material to form a silicide, the reacting comprising using an anneal at a temperature from 400 ° C. to 900 ° C. for a duration of 20 seconds to 180 seconds, after the reacting, a thickness of the silicide being between 40 Å and 250 Å, and the annealing causing all of the titanium layer on the bottom surface of the opening to react with the semiconductor material such that the titanium nitride layer directly adjoins the silicide; and depositing a conductive material on the titanium nitride layer in the opening.

* * * * *